US012641813B2

(12) United States Patent
Liu et al.

(10) Patent No.: US 12,641,813 B2
(45) Date of Patent: May 26, 2026

(54) METHOD FOR MANUFACTURING THIN FILM TRANSISTOR, AND THIN FILM TRANSISTOR

(71) Applicant: BOE Technology Group Co., Ltd., Beijing (CN)

(72) Inventors: Fengjuan Liu, Beijing (CN); Dongfang Wang, Beijing (CN); Wei Liu, Beijing (CN); Yuhang Lu, Beijing (CN); Hongda Sun, Beijing (CN); Ce Ning, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 490 days.

(21) Appl. No.: 18/022,620

(22) PCT Filed: Mar. 9, 2022

(86) PCT No.: PCT/CN2022/079869
§ 371 (c)(1),
(2) Date: Feb. 22, 2023

(87) PCT Pub. No.: WO2022/267554
PCT Pub. Date: Dec. 29, 2022

(65) Prior Publication Data
US 2023/0317826 A1 Oct. 5, 2023

(30) Foreign Application Priority Data
Jun. 24, 2021 (CN) .......................... 202110702986.7

(51) Int. Cl.
H10D 30/01 (2025.01)
H10D 30/67 (2025.01)
H10D 64/01 (2025.01)

(52) U.S. Cl.
CPC ....... H10D 30/031 (2025.01); H10D 30/6755 (2025.01); H10D 64/01 (2025.01)

(58) Field of Classification Search
CPC ... H10D 30/031; H10D 30/6755; H10D 64/01
See application file for complete search history.

(56) References Cited

U.S. PATENT DOCUMENTS

2017/0294544 A1* 10/2017 Hsin .................. H10D 30/6737

FOREIGN PATENT DOCUMENTS

| CN | 202601619 | U | * | 12/2012 |
| CN | 104217994 | A | | 12/2014 |
(Continued)

OTHER PUBLICATIONS

First Office Action issued on Nov. 30, 2024, for application No. CN202110702986.7 with English translation attached.
(Continued)

*Primary Examiner* — Jay C Kim
*Assistant Examiner* — Woo K Lee
(74) *Attorney, Agent, or Firm* — Nath, Goldberg & Meyer; Joshua B. Goldberg

(57) ABSTRACT

A method for manufacturing a thin film transistor, and a thin film transistor are provided. The method includes: forming an active layer on a substrate by a single patterning process; forming a gate insulating layer by deposition on a side of the active layer away from the substrate; forming a first via hole and a second via hole penetrating through the gate insulating layer by a single patterning process, the first and second via holes being located at two ends of the active layer respectively; and forming a first electrode, a gate electrode, and a second electrode on the gate insulating layer by a single patterning process, the first and second electrodes being connected to the active layer through the first and second via holes, respectively, and an orthographic projection of the
(Continued)

gate electrode on the substrate at least partially overlapping that of the active layer on the substrate.

17 Claims, 9 Drawing Sheets

(56)                    References Cited

FOREIGN PATENT DOCUMENTS

| CN | 105097948 | A | 11/2015 | | |
|----|-----------|---|---------|---|---|
| CN | 105870169 | A | 8/2016 | | |
| CN | 107359126 | A | 11/2017 | | |
| CN | 107452808 | A | 12/2017 | | |
| CN | 107799570 | A | 3/2018 | | |
| CN | 108447822 | A | 8/2018 | | |
| CN | 108470717 | A | 8/2018 | | |
| CN | 109638078 | A | 4/2019 | | |
| CN | 110190031 | A | 8/2019 | | |
| CN | 110993612 | A | 4/2020 | | |
| CN | 110993695 | A | 4/2020 | | |
| CN | 112599606 | A | 4/2021 | | |
| CN | 113299559 | A | 8/2021 | | |
| CN | 215644387 | U | 1/2022 | | |
| KR | 20160053376 | A | 5/2016 | | |
| WO | WO-2018153089 | A1 * | 8/2018 | ............. | H01L 21/77 |

OTHER PUBLICATIONS

The Second Office Action dated Sep. 27, 2025 corresponding to Chinese application No. 202110702986.7.

* cited by examiner

| form an active layer on a substrate by a single patterning process | S201 |

↓

| form a gate insulating layer by deposition on a side of the active layer away from the substrate | S202 |

↓

| form a first via hole and a second via hole, which penetrate through the gate insulating layer, by a single patterning process; the first via hole and the second via hole are located at two ends of the active layer respectively | S203 |

↓

| form a first electrode, a gate electrode, and a second electrode on the gate insulating layer by a single patterning process; the first electrode is connected to the active layer through the first via hole, the second electrode is connected to the active layer through the second via hole, and an orthographic projection of the gate electrode on the substrate at least partially overlaps that of the active layer on the substrate | S204 |

↓

| etch a part of the gate insulating layer which is not covered by the first electrode, the gate electrode, and the second electrode by using the first electrode, the gate electrode, and the second electrode as a mask to expose a part of the active layer | S2051 |

↓

| perform conductorization process on the exposed part of the active layer, and parts of the active layer which are covered by the first electrode and the second electrode | S2052 |

FIG. 2

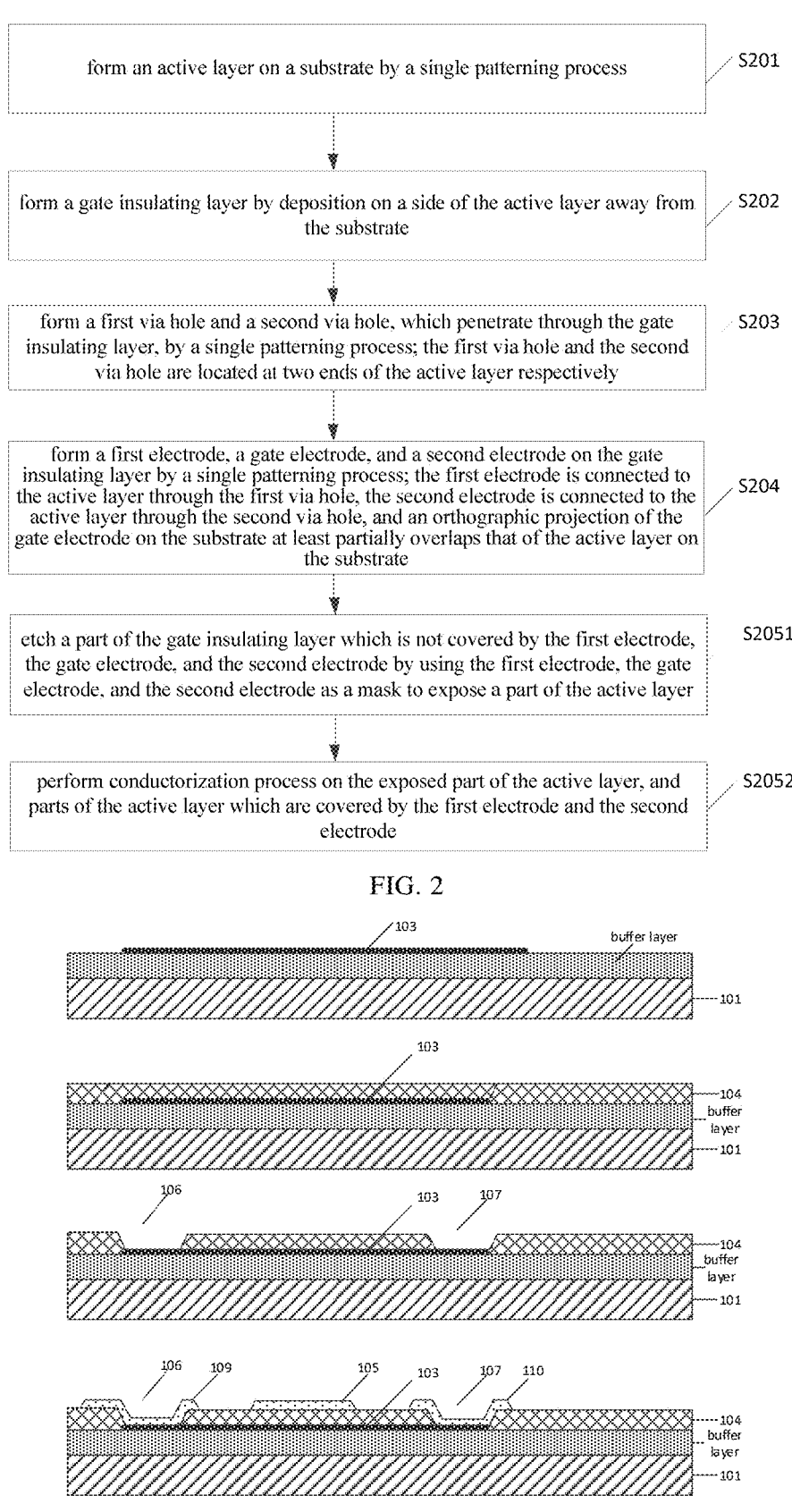

FIG. 3

METHOD FOR MANUFACTURING THIN FILM TRANSISTOR, AND THIN FILM TRANSISTOR

CROSS REFERENCE TO RELATED APPLICATION

This is a National Phase Application filed under 35 U.S.C. 371 as a national stage of PCT/CN2022/079869, filed on Mar. 9, 2022, an application claiming the benefit of Chinese Application No. 202110702986.7, filed on Jun. 24, 2021, the content of each of which is hereby incorporated by reference in its entirety.

TECHNICAL FIELD

The present disclosure belongs to the field of display technology, and particularly relates to a method for manufacturing a thin film transistor, and a thin film transistor.

BACKGROUND

As important switching control elements, thin film transistors play a critical role in display devices. In order that a display device has good image display quality, thin film transistors are generally disposed in a display panel of the display device in the related art.

Masks are generally used for patterning processes in a manufacturing process of a thin film transistor. Current methods for manufacturing the thin film transistor are complex, and correspondingly the number of the used masks is relatively large. Due to a high cost of the masks, the current methods for manufacturing the thin film transistor are not beneficial for cost control.

SUMMARY

In order to solve at least one of the problems in the related art, the present disclosure provides a method for manufacturing a thin film transistor, and a thin film transistor.

In a first aspect, embodiments of the present disclosure provide a method for manufacturing a thin film transistor, including:

forming an active layer on a substrate by a single patterning process;

forming a gate insulating layer by deposition on a side of the active layer away from the substrate;

forming a first via hole and a second via hole, which penetrate through the gate insulating layer, by a single patterning process, the first via hole and the second via hole being located at two ends of the active layer, respectively;

forming a first electrode, a gate electrode, and a second electrode on the gate insulating layer by a single patterning process, the first electrode being connected to the active layer through the first via hole, the second electrode being connected to the active layer through the second via hole, and an orthographic projection of the gate electrode on the substrate at least partially overlapping an orthographic projection of the active layer on the substrate.

In an embodiment, before forming the active layer on the substrate by the single patterning process, the method for manufacturing a thin film transistor further includes:

forming a barrier layer on the substrate by a single patterning process, an orthographic projection of the barrier layer on the substrate at least partially overlapping the orthographic projection of the active layer on the substrate; and forming a buffer layer on a side of the barrier layer away from the substrate.

In an embodiment, before forming the first electrode, the gate electrode, and the second electrode on the gate insulating layer by the single patterning process, the method for manufacturing a thin film transistor further includes:

forming a third via hole penetrating through the gate insulating layer and the buffer layer by a single patterning process, so that the second electrode is connected to the barrier layer through the third via hole.

In an embodiment, an orthographic projection of the first electrode on the substrate only partially overlaps an orthographic projection of the first via hole on the substrate; and an orthographic projection of the second electrode on the substrate only partially overlaps an orthographic projection of the second via hole on the substrate.

In an embodiment, a material of the first electrode and the second electrode includes copper, and a material of the active layer includes an oxide semiconductor material; or, the material of the first electrode and the second electrode includes aluminum, and the material of the active layer includes an oxide semiconductor material containing zinc.

In an embodiment, after forming the first electrode, the gate electrode, and the second electrode on the gate insulating layer by the single patterning process, the method for manufacturing a thin film transistor further includes:

performing conductorization process on areas of the active layer corresponding to the first via hole and the second via hole.

In an embodiment, performing the conductorization process on the areas of the active layer corresponding to the first via hole and the second via hole includes:

etching a part, which is not covered by the first electrode, the gate electrode, and the second electrode, of the gate insulating layer by using the first electrode, the gate electrode, and the second electrode as a mask to expose a part of the active layer; and performing the conductorization process on the exposed part of the active layer.

In an embodiment, before performing the conductorization process on the areas of the active layer corresponding to the first via hole and the second via hole, the method for manufacturing a thin film transistor further includes:

keeping or stripping off a photoresist on the first electrode, the gate electrode, and the second electrode.

In an embodiment, after forming the first electrode, the gate electrode, and the second electrode on the gate insulating layer by the single patterning process, the method for manufacturing a thin film transistor further includes:

etching a part, which is not covered by the first electrode, the gate electrode, and the second electrode, of the gate insulating layer by using the first electrode, the gate electrode, and the second electrode as a mask to only partially etch the gate insulating layer.

In an embodiment, after forming the first electrode, the gate electrode, and the second electrode on the gate insulating layer by the single patterning process, the method for manufacturing a thin film transistor further includes:

etching the gate insulating layer by a dry etching process to only partially etch the gate insulating layer.

In a second aspect, the embodiments of the present disclosure provide a thin film transistor, including: a substrate, an active layer on the substrate, a gate insulating layer on a side of the active layer away from the substrate, and a first electrode, a gate electrode, and a second electrode, which are on a side of the gate insulating layer away from the substrate; and the first electrode is connected to one end of the active layer through a first via hole penetrating through the gate insulating layer; the second electrode is connected to the other end of the active layer through a second via hole penetrating through the gate insulating layer; and an orthographic projection of the gate electrode on the substrate at least partially overlaps an orthographic projection of the active layer on the substrate.

In an embodiment, the thin film transistor further includes: a barrier layer on the substrate, and a buffer layer on a side of the barrier layer away from the substrate; and an orthographic projection of the barrier layer on the substrate at least partially overlaps the orthographic projection of the active layer on the substrate.

In an embodiment, the second electrode is connected to the barrier layer through a third via hole penetrating through the gate insulating layer and the buffer layer.

In an embodiment, an orthographic projection of the first electrode on the substrate only partially overlaps an orthographic projection of the first via hole on the substrate; and an orthographic projection of the second electrode on the substrate only partially overlaps an orthographic projection of the second via hole on the substrate.

In an embodiment, the thin film transistor further includes: a fourth via hole and a fifth via hole, which penetrate through the gate insulating layer;

the fourth via hole is between the first electrode and the gate electrode; and the fifth via hole is between the gate electrode and the second electrode.

BRIEF DESCRIPTION OF DRAWINGS

FIG. 2 is a flowchart illustrating a method for manufacturing a thin film transistor according to an embodiment of the present disclosure;

FIG. 3 is a schematic diagram of structures corresponding to respective steps of the method for manufacturing a thin film transistor shown in FIG. 2;

DETAIL DESCRIPTION OF EMBODIMENTS

In order to enable those of ordinary skill in the art to better understand the technical solutions of the present disclosure, the present disclosure is further described in detail below with reference to the drawings and specific embodiments.

Unless otherwise defined, technical terms or scientific terms used herein should have general meanings that are understood by those of ordinary skills in the technical field to which the present disclosure belongs. The words "first", "second" and the like used herein do not denote any order, quantity or importance, but are just used to distinguish between different elements. Similarly, the words "one", "a", "the" and the like do not denote a limitation to quantity, and indicate the existence of "at least one" instead. The words "include", "comprise" and the like indicate that an element or object before the words covers the elements or objects listed after the words or the equivalents thereof, rather than excluding other elements or objects. The words "connect", "couple" and the like are not restricted to physical or mechanical connection, but may also indicate electrical connection, whether direct or indirect. The words "on", "under", "left", "right" and the like are only used to indicate relative positional relationships. When an absolute position of an object described is changed, the relative positional relationships may also be changed accordingly.

Figure 1:
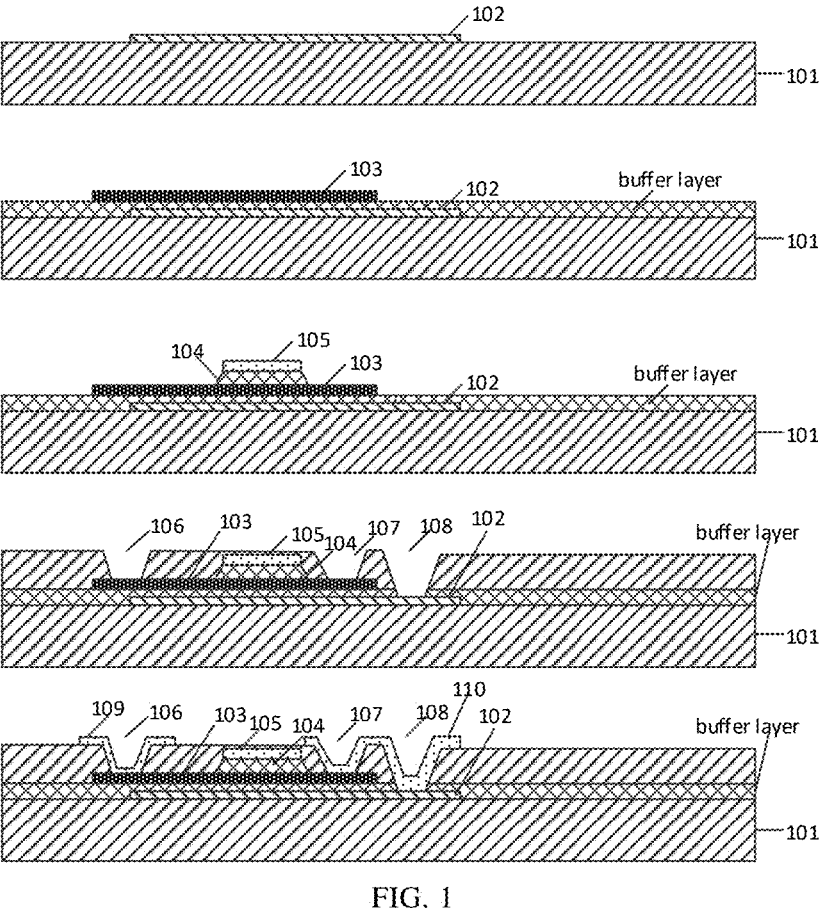
FIG. 1 is a schematic diagram illustrating process steps of an exemplary method for manufacturing a thin film transistor.

FIG. 1 is a schematic diagram illustrating process steps of an exemplary method for manufacturing a thin film transistor. As shown in FIG. 1, the method for manufacturing a thin film transistor includes the following steps: forming a barrier layer 102 on a substrate 101 by a single patterning process; forming a buffer layer on the barrier layer 102; forming an active layer 103 on the buffer layer by a single patterning process; forming a gate insulating layer 104 and a gate electrode 105 on the active layer 103 by a single patterning process; forming an interlayer insulating layer on the gate electrode 105; forming a first via hole 106 and a second via hole 107, which penetrate through the interlayer insulating layer, by a single patterning process; forming a third via hole 108 penetrating through the interlayer insulating layer and the buffer layer by a single patterning process; and finally forming a first electrode 109 and a second electrode 110 on the interlayer insulating layer by a single patterning process. The first electrode 109 is connected to one end of the active layer 103 through the first via hole 106, the second electrode 110 is connected to the other end of the active layer 103 through the second via hole 107, and meanwhile the second electrode is connected to the barrier layer 102 through the third via hole 108, so that the barrier layer 102 is prevented from being floating to avoid parasitic capacitance generated between the barrier layer 102 and a metal layer in the thin film transistor, thereby avoiding an influence of the parasitic capacitance on performance of the thin film transistor. It can be seen from the above method for manufacturing a thin film transistor that a mask is needed for the patterning process in each of the steps of forming the barrier layer 102, the active layer 103, the gate electrode 105, the first via 106, the second via 107, the third via 108, the first electrode 109, and the second electrode 110 while manufacturing the above thin film transistor, with the result that at least six layers of masks are needed in total for manufacturing the thin film transistor. Since the number of the masks needed is relatively large and the manufactured thin film transistor is complex in structure, cost control is not favored.

In order to solve at least one of the above technical problems, the present disclosure provides a method for manufacturing a thin film transistor, and a thin film transistor, which will be described in detail below with reference to the drawings and specific embodiments.

FIG. 2 is a flowchart illustrating a method for manufacturing a thin film transistor according to the embodiments of the present disclosure, and FIG. 3 is a schematic diagram of structures corresponding to respective steps of the method for manufacturing a thin film transistor shown in FIG. 2. As shown in FIG. 2 and FIG. 3, the method for manufacturing a thin film transistor includes the following steps S201 to S204.

In S201, an active layer is formed on a substrate by a single patterning process.

As shown in FIG. 3, in a manufacturing process, a buffer layer may be first formed on a substrate 101 to provide a flat surface to facilitate arrangement of other functional layers of the thin film transistor. The buffer layer may be formed on the substrate 101 by deposition or by other means. For example, the buffer layer may be formed on the entire substrate 101, and made of an inorganic insulating material such as silicon oxide, silicon nitride or silicon oxynitride. A barrier layer may be further formed on the substrate 101 before an active layer 103 is formed, so as to prevent impurities such as water and oxygen from penetrating into other functional layers of the thin film transistor from the substrate 101. Meanwhile, the barrier layer and the buffer layer can protect the other functional layers of the thin film transistor together. After the buffer layer is formed, the active layer 103 is then formed by performing a single patterning process. The active layer 103 may be made of polysilicon, a metal oxide or other material, and the material of the active layer 103 may be selected according to practical applications and is not limited herein. It should be noted that the single patterning process includes processes such as formation of a photoresist, exposure, development, and etching.

In S202, a gate insulating layer is formed by deposition on a side of the active layer away from the substrate.

As shown in FIG. 3, in the manufacturing process, a gate insulating layer 104 may be formed on a side of the active layer 103 away from the substrate 101 by deposition or by other means, and the gate insulating layer 104 may insulate the active layer 103 from a gate electrode 105 on the gate insulating layer 104, so as to avoid a short circuit between the active layer 103 and the gate electrode 105, thereby avoiding an influence of the short circuit on the performance of the thin film transistor. The gate insulating layer 104 may be made of an inorganic insulating material such as silicon oxide, silicon nitride or silicon oxynitride, and the material of the gate insulating layer 104 may be selected according to practical applications and is not limited herein.

In S203, a first via hole and a second via hole, which penetrate through the gate insulating layer, are formed by a single patterning process; and the first via hole and the second via hole are located at two ends of the active layer, respectively.

As shown in FIG. 3, in the manufacturing process, the gate insulating layer 104 covering both ends of the active layer 103 may be etched to form a first via hole 106 and a second via hole 107 that expose the active layer 103. Specifically, the first via hole 106 and the second via hole 107 correspond to a first electrode contact region and a second electrode contact region of the active layer 103, respectively.

In S204, a first electrode, a gate electrode, and a second electrode are formed on the gate insulating layer by a single patterning process; the first electrode is connected to the active layer through the first via hole, and the second electrode is connected to the active layer through the second via hole; and an orthographic projection of the gate electrode on the substrate at least partially overlaps that of the active layer on the substrate.

As shown in FIG. 3, in the manufacturing process, a metal layer may be formed on the gate insulating layer 104 by deposition, and a material of the metal layer may be a metal such as aluminum, copper, titanium or cobalt, or an alloy material. In the manufacturing process, the metal layer is first formed by sputtering or evaporation or by other means, and a single patterning process is then performed on the metal layer to form a first electrode 109, a gate electrode 105, and a second electrode 110 that are patterned, so that the first electrode 109 is connected to one end of the active layer 103 through the first via hole 106 and the second electrode 110 is connected to the other end of the active layer through the second via hole 107, thus finally forming the whole structure of the thin film transistor.

In the method for manufacturing a thin film transistor provided by the embodiments of the present disclosure, the first electrode 109, the gate electrode 105, and the second electrode 110 can be formed by a single patterning process, with no need to use masks to form the first electrode 109, the gate electrode 105, and the second electrode 110 separately. Thus, only three masks need to be used in all the steps of the method for manufacturing a thin film transistor, and the formed thin film transistor is simple in structure. Thus, as compared with the method for manufacturing a thin film transistor shown in FIG. 1, the method for manufacturing a thin film transistor provided by the embodiments of the present disclosure can effectively reduce the number of the masks used in the manufacturing process, so as to reduce the number of the masks, thereby achieving reasonable control of a manufacturing cost of the thin film transistor.

Figure 4:
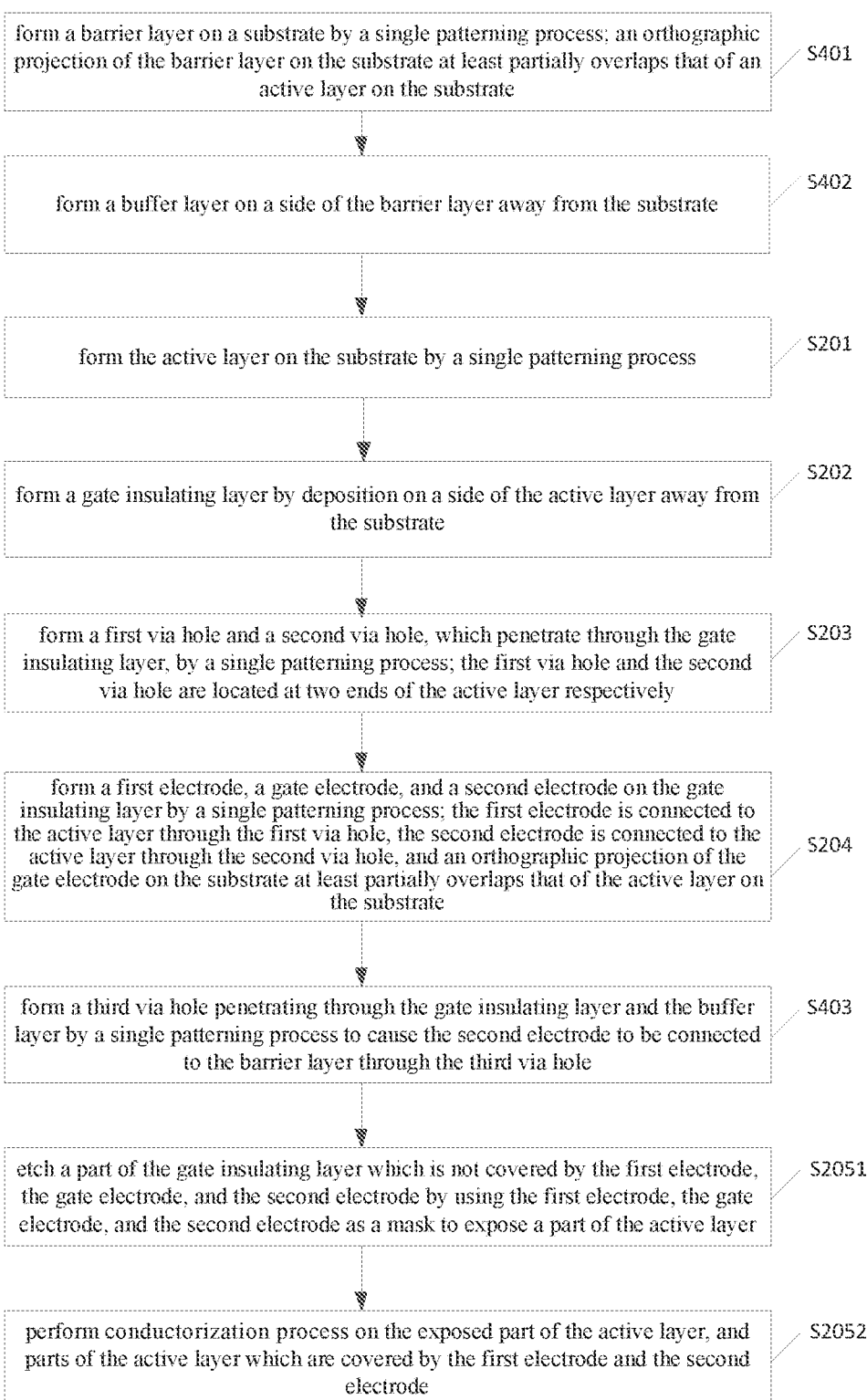
FIG. 4 is another method for manufacturing a thin film transistor according to an embodiment of the present disclosure.
Figure 5:
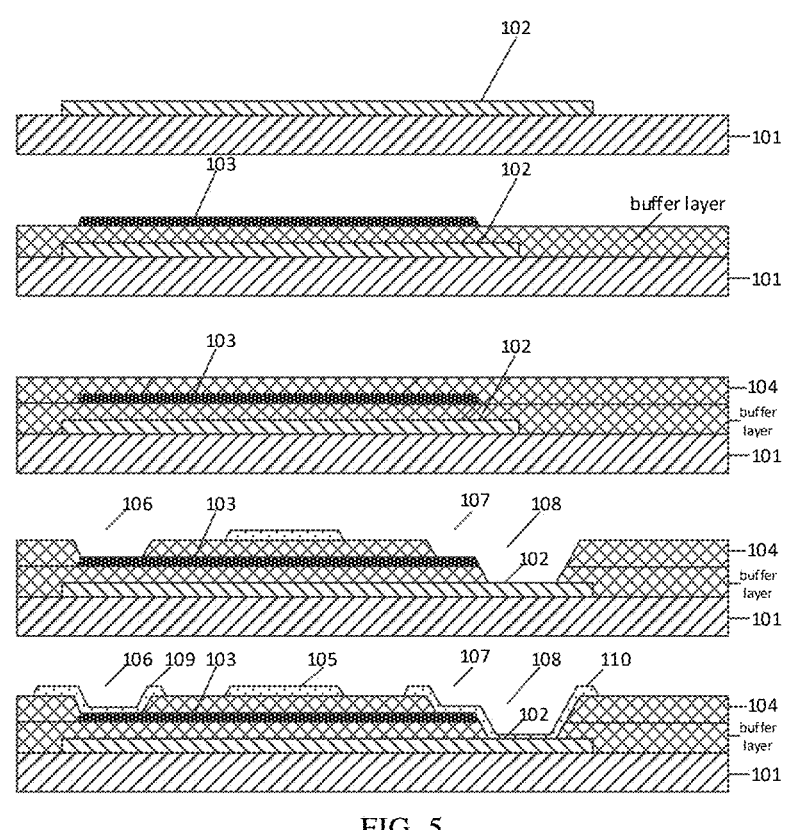
FIG. 5 is a schematic diagram of structures corresponding to respective steps of the method for manufacturing a thin film transistor shown in FIG. 4.

FIG. 4 is another method for manufacturing a thin film transistor according to the embodiments of the present disclosure, and FIG. 5 is a schematic diagram of structures corresponding to respective steps of the method for manufacturing a thin film transistor shown in FIG. 4. As shown in FIG. 4 and FIG. 5, before the step S201, the method for manufacturing a thin film transistor further includes the following steps:

S401, forming a barrier layer on the substrate by a single patterning process, an orthographic projection of the barrier layer on the substrate at least partially overlapping that of the active layer on the substrate; and S402, forming a buffer layer on a side of the barrier layer away from the substrate.

It should be noted that a barrier layer 102 may be formed on the substrate 101 and may be a metal layer, and a material of the barrier layer 102 may specifically be a metal such as aluminum, copper, titanium or cobalt, or an alloy material. The barrier layer 102 is an opaque film layer, and may prevent light from reaching the active layer 103 from a side of the substrate 101, so that an influence of the light on the active layer 103 may be avoided, thereby ensuring overall performance of the thin film transistor. The buffer layer may be formed on the barrier layer 102 by deposition or by other means. For example, the buffer layer may be formed on the entire barrier layer 102, and made of an inorganic insulating material such as silicon oxide, silicon nitride, or silicon oxynitride.

In some embodiments, as shown in FIG. 4 and FIG. 5, before the step S204, the method for manufacturing a thin film transistor further includes the follow step:

S403, forming a third via hole penetrating through the gate insulating layer and the buffer layer by a single patterning process, so that the second electrode can be connected to the barrier layer through the third via hole.

A third via hole 108 may be adjacent to the second via hole 107, or may be integrated with the second via hole 107. A difference between the third via hole 108 and the second via hole 107 lies in that a depth of the third via hole 108 is greater than that of the second via hole 107, so that the second electrode 110 can be connected to the other end of the active layer 103 through the second via hole 107, and meanwhile the second electrode 110 can be connected to the barrier layer 102 through the third via hole 108. In the embodiments of the present disclosure, the second electrode 110 may be connected to the barrier layer 102, so that the barrier layer 102 is prevented from being floating to avoid parasitic capacitance generated between the barrier layer 102 and a metal layer in the thin film transistor, thereby avoiding the influence of the parasitic capacitance on the performance of the thin film transistor.

It can be seen from FIG. 4 and FIG. 5 that only five masks need to be used in all the steps of the method for manufacturing a thin film transistor provided by the embodiments of the present disclosure, and the formed thin film transistor is simple in structure. Thus, as compared with the method for manufacturing a thin film transistor shown in FIG. 1, the method for manufacturing a thin film transistor provided by the embodiments of the present disclosure can effectively reduce the number of the masks used in the manufacturing process, so as to reduce the number of the masks, thereby achieving the reasonable control of the manufacturing cost of the thin film transistor.

Figure 6:
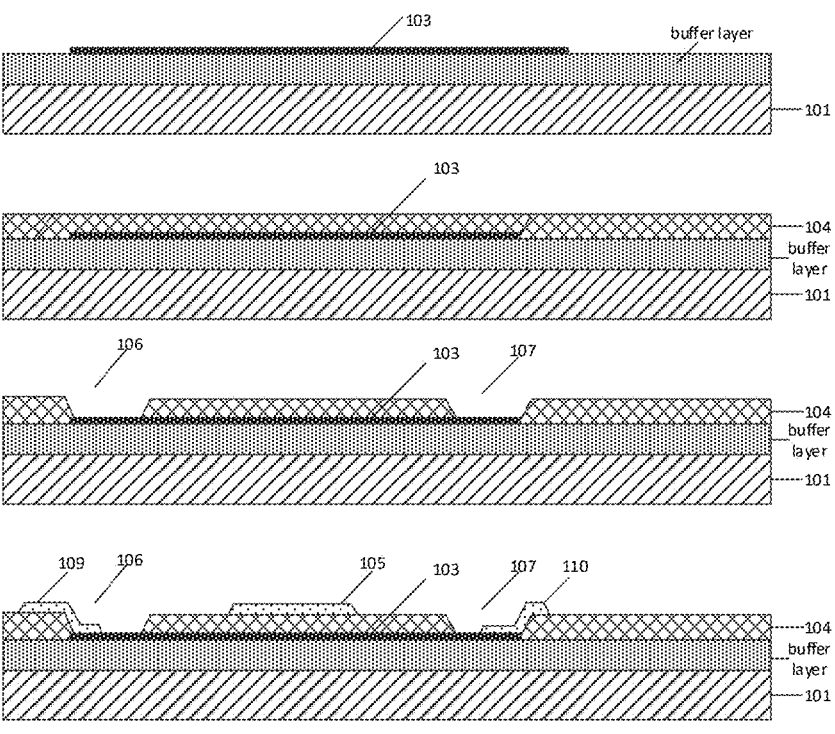
FIG. 6 is another schematic diagram of structures corresponding to respective steps of the method for manufacturing a thin film transistor shown in FIG. 2.
Figures 7, 8:
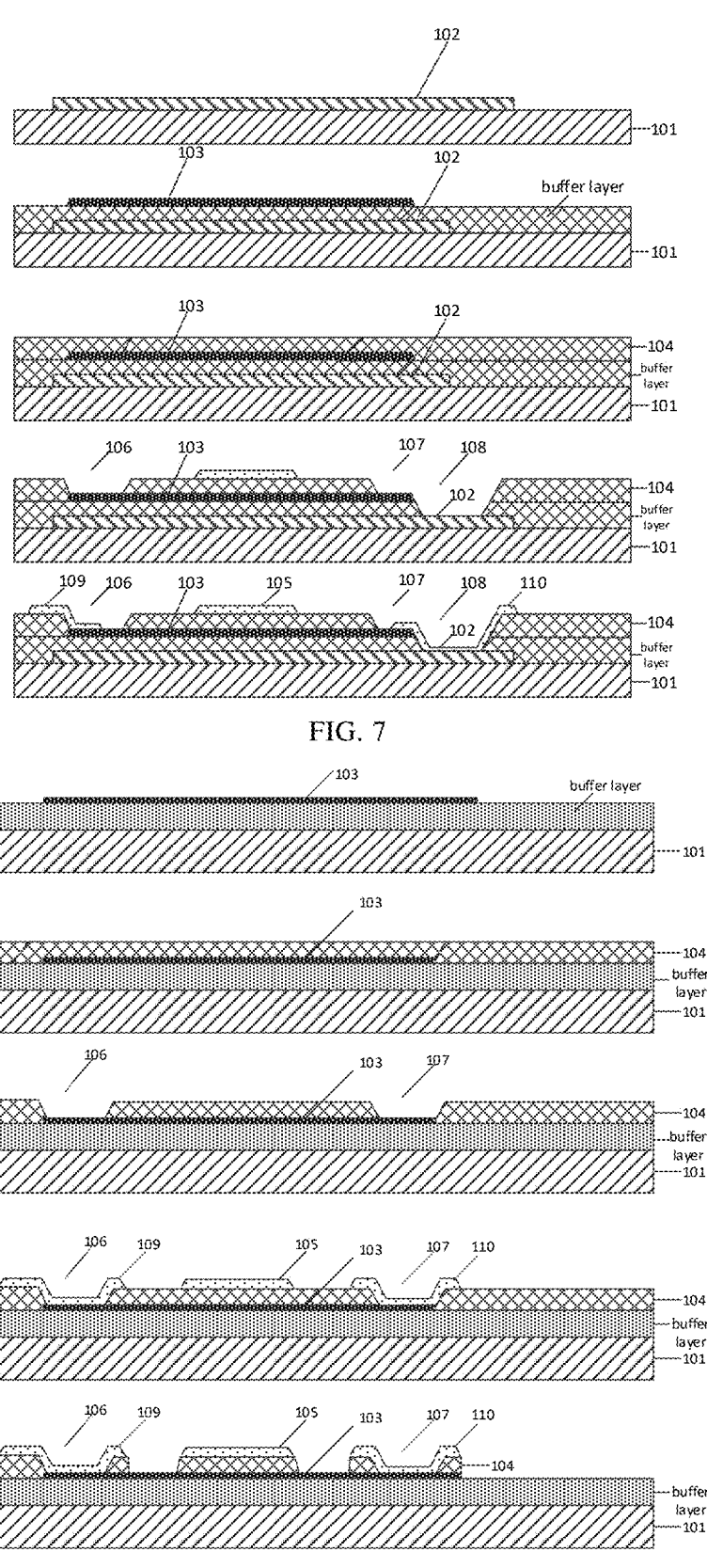
FIG. 7 is another schematic diagram of structures corresponding to respective steps of the method for manufacturing a thin film transistor shown in FIG. 4.
FIG. 8 is still another schematic diagram of structures corresponding to respective steps of the method for manufacturing a thin film transistor shown in FIG. 2.

In some embodiments, FIG. 6 is another schematic diagram of structures corresponding to respective steps of the method for manufacturing a thin film transistor shown in FIG. 2, and FIG. 7 is another schematic diagram of structures corresponding to respective steps of the method for manufacturing a thin film transistor shown in FIG. 4. As shown in FIG. 6 and FIG. 7, in the step S204, an orthographic projection of the first electrode 109 on the substrate 101 only partially overlaps that of the first via hole 106 on the substrate 101; and an orthographic projection of the second electrode 110 on the substrate 101 only partially overlaps that of the second via hole 107 on the substrate 101.

As shown in FIG. 6 and FIG. 7, in the manufacturing process, etching sizes of the first via hole 106 and the second via hole 107 may be increased such that the first electrode 109 covers only a part of the first via hole 106 to expose a part of the active layer 103, and the second electrode 110 covers only a part of the second via hole 107 to expose a part of the active layer 103, and thus conductive resistance of the active layer 103 perpendicular to areas of the first electrode 109 and the second electrode 110 can be reduced, thereby facilitating transmission of electrical signals, and improving the overall performance of the thin film transistor. Specifically, the material of the metal layer formed into the first electrode 109 and the second electrode 110 and the material of the active layer may be selected to be those having large etching selectivity. For example, the material of the first electrode 109 and the second electrode 110 may be copper and the material of the active layer 103 may be an oxide semiconductor material; alternatively, the material of the first electrode 109 and the second electrode 110 may be aluminum and the material of the active layer 103 may be an oxide semiconductor material containing zinc.

In some embodiments, as shown in FIG. 2 and FIG. 4, after the step S204, the method for manufacturing a thin film transistor further includes:

step S205, performing conductorization process on areas of the active layer corresponding to the first via hole and the second via hole.

In the manufacturing process, areas of the active layer 103 corresponding to the first via hole 106 and the second via hole 107 may be processed by ion implantation or heavy doping to make the two ends of the active layer 103 conductive, so as to form a first electrode connection region and a second electrode connection region. Thus, it is ensured that ohmic connection is formed between the first electrode 109 and the active layer 103 and between the second electrode 110 and the active layer 103, thereby reducing connection resistance, and improving the overall performance of the thin film transistor.

In some embodiments, as shown in FIG. 2 and FIG. 4, the step S205 specifically includes:

step S2051, etching a part of the gate insulating layer, which is not covered by the first electrode, the gate electrode, and the second electrode, by using the first electrode, the gate electrode, and the second electrode as a mask to expose a part of the active layer; and step S2052, performing conductorization process on the exposed part of the active layer and parts of the active layer which are covered by the first electrode and the second electrode.

Figure 9:
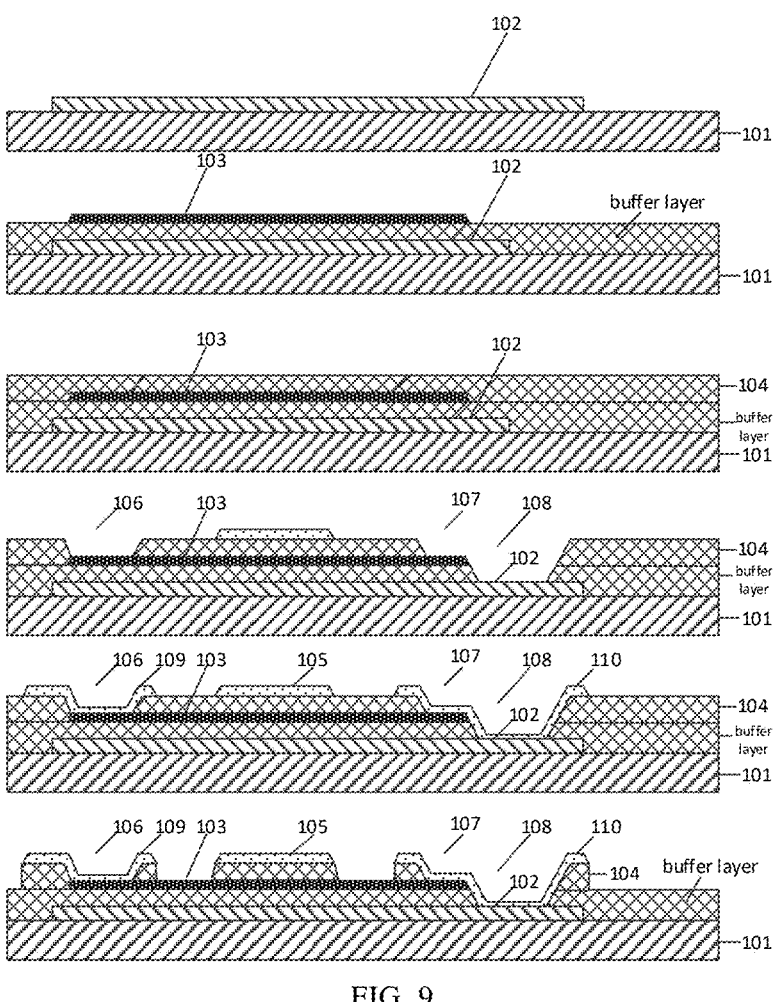
FIG. 9 is still another schematic diagram of structures corresponding to respective steps of the method for manufacturing a thin film transistor shown in FIG. 4.
Figure 10:
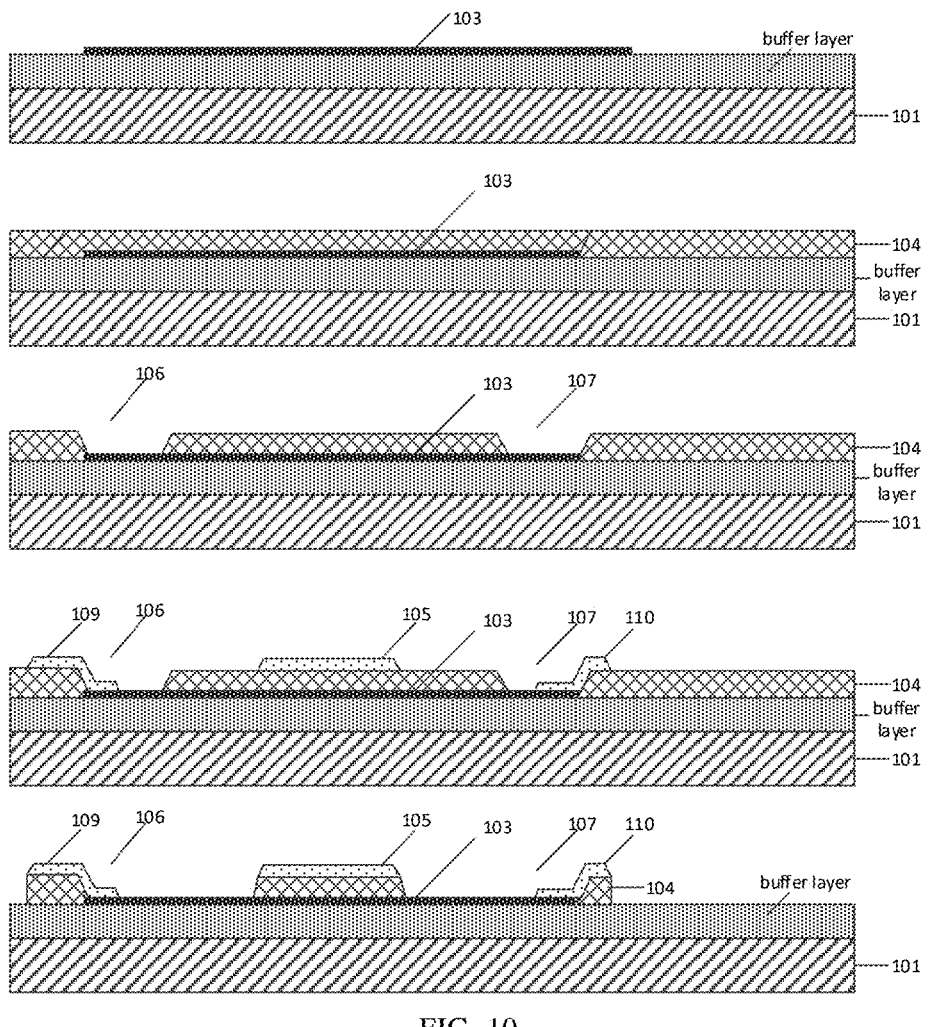
FIG. 10 is yet another schematic diagram of structures corresponding to respective steps of the method for manufacturing a thin film transistor shown in FIG. 2.
Figure 11:
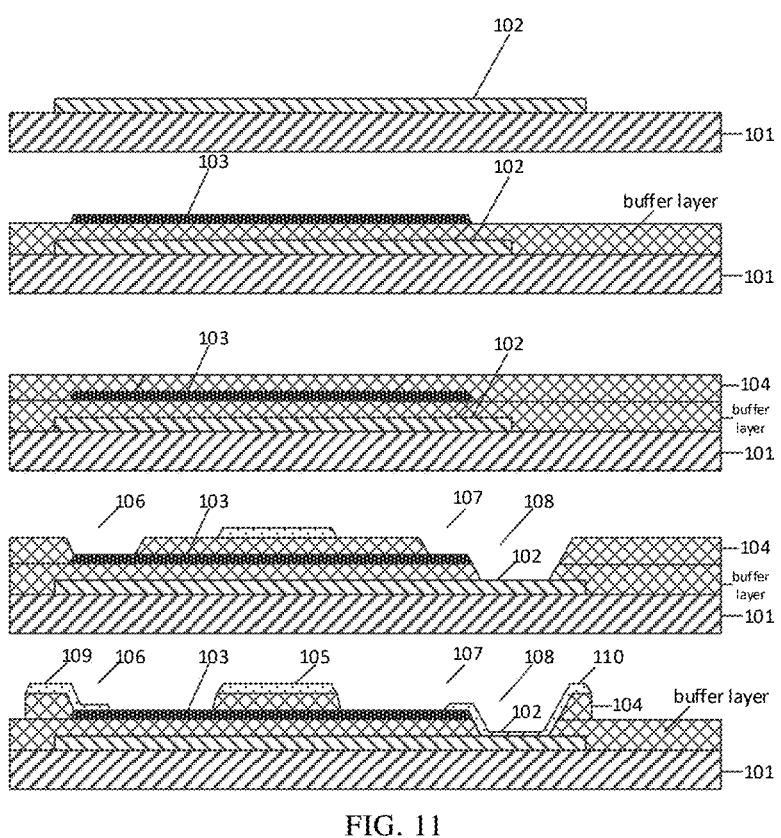
FIG. 11 is yet another schematic diagram of structures corresponding to respective steps of the method for manufacturing a thin film transistor shown in FIG. 4.

FIG. 8 is still another schematic diagram of structures corresponding to respective steps of the method for manufacturing a thin film transistor shown in FIG. 2, FIG. 9 is still another schematic diagram of structures corresponding to respective steps of the method for manufacturing a thin film transistor shown in FIG. 4, FIG. 10 is yet another schematic diagram of structures corresponding to respective steps of the method for manufacturing a thin film transistor shown in FIG. 2, and FIG. 11 is yet another schematic diagram of structures corresponding to respective steps of the method for manufacturing a thin film transistor shown in FIG. 4. As shown in FIG. 8, FIG. 9, FIG. 10, and FIG. 11, in the manufacturing process, the gate insulating layer 104 may be etched by a dry etching process using the first electrode 109, the gate electrode 105, and the second electrode 110 as a mask, so that a part of the gate insulating layer 104 which is not covered by the first electrode 109, the gate electrode 105, and the second electrode 110, is etched to facilitate performing conductorization process on an exposed part of the active layer 103.

In some embodiments, before the step S205, the method for manufacturing a thin film transistor further includes: keeping or stripping off a photoresist on the first electrode, the gate electrode, and the second electrode.

In the manufacturing process, a photoresist deposited during etching of the first electrode 109, the gate electrode 105, and the second electrode 110 may be kept, so that the gate insulating layer 104 may be directly etched, thereby reducing the number of the process steps, and increasing manufacturing efficiency. Alternatively, the photoresist deposited during the etching of the first electrode 109, the gate electrode 105, and the second electrode 110 may be stripped off to expose the first electrode 109, the gate electrode 105, and the second electrode 110 to allow for accurate etching, so that it is ensured that the part of the gate insulating layer 104 which is not covered by the first electrode 109, the gate electrode 105, and the second electrode 110 can be completely etched, thereby facilitating the conductorization process of the active layer 103.

In some embodiments, after the step S204, the method for manufacturing a thin film transistor further includes: etching a part of the gate insulating layer which is not covered by the first electrode, the gate electrode, and the second electrode by using the first electrode, the gate electrode, and the second electrode as a mask to only partially etch the gate insulating layer.

In the manufacturing process, the gate insulating layer 104 may be etched by using the first electrode 109, the gate electrode 105, and the second electrode 110 as the mask, the etching method may be wet etching, and the gate insulating layer 104 is only etched with a general etching thickness, which specifically ranges from 20 nm to 100 nm, so that the conductive resistance of the active layer 103 perpendicular to the areas of the first electrode 109 and the second electrode 110 can be reduced, thereby facilitating the transmission of the electrical signals, and improving the overall performance of the thin film transistor.

In some embodiments, after the step S204, the method for manufacturing a thin film transistor further includes: performing a dry etching process on the gate insulating layer to only partially etch the gate insulating layer.

In the manufacturing process, the gate insulating layer 104 may be etched by using the first electrode 109, the gate electrode 105, and the second electrode 110 as the mask, the etching method may be dry etching, and the gate insulating layer 104 is only etched with a general etching thickness, which specifically ranges from 20 nm to 100 nm, so that the conductive resistance of the active layer 103 perpendicular to the areas of the first electrode 109 and the second electrode 110 may be reduced, thereby facilitating the transmission of the electrical signals, and improving the overall performance of the thin film transistor.

Figure 12:
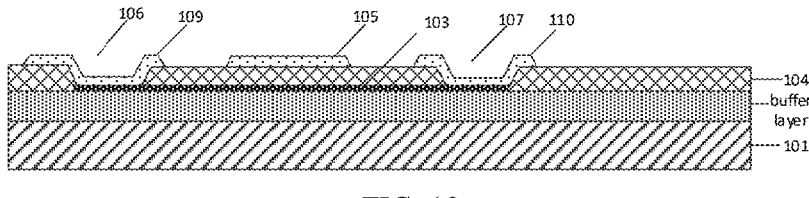
FIG. 12 is a schematic structural diagram of a thin film transistor according to an embodiment of the present disclosure.

In a second aspect, the embodiments of the present disclosure provide a thin film transistor, and FIG. 12 is a schematic structural diagram of a thin film transistor according to the embodiments of the present disclosure. As shown in FIG. 12, the thin film transistor includes: a substrate 101, an active layer 103 located on the substrate 101, a gate insulating layer 104 located on a side of the active layer 103 away from the substrate 101, and a first electrode 109, a gate electrode 105, and a second electrode 110, which are located on a side of the gate insulating layer 104 away from the substrate 101. The first electrode 109 is connected to one end of the active layer 103 through a first via hole 106 penetrating through the gate insulating layer 104; the second electrode 110 is connected to the other end of the active layer 103 through a second via hole 107 penetrating through the gate insulating layer 104. An orthographic projection of the gate electrode 105 on the substrate 101 at least partially overlaps that of the active layer 103 on the substrate 101.

In the thin film transistor provided by the embodiments of the present disclosure, the first electrode 109, the gate electrode 105, and the second electrode 110 are all located on the side of the gate insulating layer 104 away from the substrate 101, that is, the first electrode 109, the gate electrode 105, and the second electrode 110 are located in the same film layer, which can reduce, compared with the thin film transistor formed by the manufacturing method shown in FIG. 1, the number of film layers in the thin film transistor, so as to effectively reduce a thickness of the thin film transistor, thereby facilitating lightening and thinning of products. Meanwhile, in a manufacturing process, the first electrode 109, the gate electrode 105, and the second electrode 110 may be formed by a single patterning process, with no need to use masks to form the first electrode 109, the gate electrode 105, and the second electrode 110 separately. Thus, only three masks need to be used in all steps of a method for manufacturing the thin film transistor, so that the number of the masks used in the manufacturing method can be effectively reduced to reduce the number of the masks, thereby achieving the reasonable control of the manufacturing cost of the thin film transistor.

Figure 13:
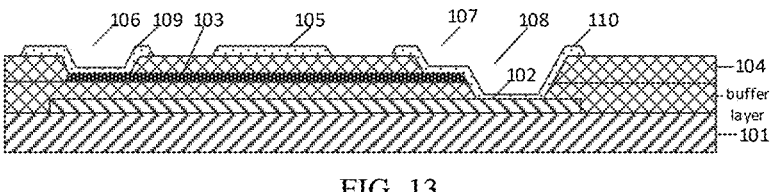
FIG. 13 is a schematic structural diagram of another thin film transistor according to an embodiment of the present disclosure.

FIG. 13 is a schematic structural diagram of another thin film transistor according to the embodiments of the present disclosure. As shown in FIG. 13, the thin film transistor further includes: a barrier layer 102 located on the substrate 101, and a buffer layer located on a side of the barrier layer 102 away from the substrate 101. An orthographic projection of the barrier layer 102 on the substrate 101 at least partially overlaps that of the active layer 103 on the substrate 101.

The barrier layer 102 may be a metal layer, and a material of the barrier layer 102 may be a metal such as aluminum, copper, titanium or cobalt, or an alloy material. The barrier layer 102 is an opaque film layer, and may prevent the light from reaching the active layer 103 from a side of the substrate 101, so that an influence of the light on the active layer 103 may be avoided, thereby ensuring overall performance of the thin film transistor. The buffer layer may be formed on the barrier layer 102 by deposition or by other means. For example, the buffer layer may be formed on the entire barrier layer 102, and made of an inorganic insulating material such as silicon oxide, silicon nitride, or silicon oxynitride. In an embodiment, the orthographic projection of the barrier layer 102 on the substrate 101 completely covers that of the active layer 103 on the substrate 101, so that not only the light vertically entering the active layer 103 from the side of the substrate 101 can be blocked, but also the light obliquely entering the active layer 103 from the side of the substrate 101 can be blocked, thereby protecting the active layer 103 from all aspects.

In some embodiments, as shown in FIG. 13, the second electrode 110 is connected to the barrier layer 102 through a third via hole 108 penetrating through the gate insulating layer 104 and the buffer layer.

The third via hole 108 may be adjacent to the second via hole 107, or may be integrated with the second via hole 107. A difference between the third via hole 108 and the second via hole 107 lies in that a depth of the third via hole 108 is greater than that of the second via hole 107, so that the second electrode 110 can be connected to the other end of the active layer 103 through the second via hole 107, and meanwhile the second electrode 110 can be connected to the barrier layer 102 through the third via hole 108. In the embodiments of the present disclosure, the second electrode 110 may be connected to the barrier layer 102, so as to prevent the barrier layer 102 from being floating to avoid parasitic capacitance generated between the barrier layer 102 and a metal layer in the thin film transistor, thereby avoiding an influence of the parasitic capacitance on the performance of the thin film transistor. On the other hand, in a case where the third via hole 108 is integrated with the second via hole 107, a step structure may be formed to prevent the deposited second electrode 110 from being broken, so as to avoid an influence of the breakage of the second electrode 110 on the performance of the thin film transistor.

Figure 14:
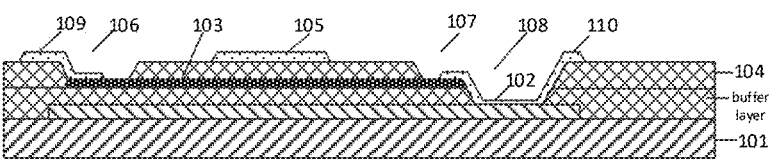
FIG. 14 is a schematic structural diagram of still another thin film transistor according to an embodiment of the present disclosure.

FIG. 14 is a schematic structural diagram of still another thin film transistor according to the embodiments of the present disclosure. As shown in FIG. 14, an orthographic projection of the first electrode 109 on the substrate 101 only partially overlaps that of the first via 106 on the substrate 101; and an orthographic projection of the second electrode 110 on the substrate 101 only partially overlaps that of the second via 107 on the substrate 101.

In practical applications, the first electrode 109 may only cover a part of the first via hole 106 to expose a part of the active layer 103, and the second electrode 110 may only cover a part of the second via hole 107 to expose a part of the active layer 103, so that conductive resistance of the active layer 103 perpendicular to areas of the first electrode 109 and the second electrode 110 can be reduced, thereby facilitating transmission of electrical signals, and improving the overall performance of the thin film transistor. Specifically, in the manufacturing process, a material of a metal layer formed into the first electrode 109 and the second electrode 110 and a material of the active layer may be selected to be those having large etching selectivity. For example, the material of the first electrode 109 and the second electrode 110 may be copper and the material of the active layer 103 may be an oxide semiconductor material; alternatively, the material of the first electrode 109 and the second electrode 110 may be aluminum and the material of the active layer 103 may be an oxide semiconductor material containing zinc.

Figure 15:
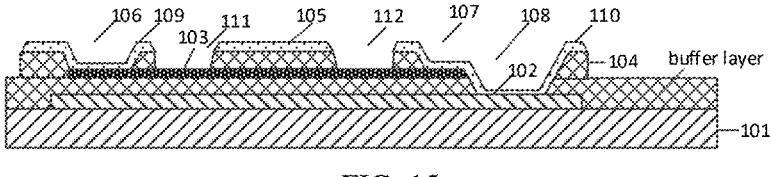
FIG. 15 is a schematic structural diagram of yet another thin film transistor according to an embodiment of the present disclosure.

FIG. 15 is a schematic structural diagram of yet another thin film transistor according to the embodiments of the present disclosure. As shown in FIG. 15, the thin film transistor further includes: a fourth via hole 111 and a fifth via hole 112, which penetrate through the gate insulating layer 104; the fourth via hole 111 is located between the first electrode 109 and the gate electrode 105; and the fifth via hole 112 is located between the gate electrode 105 and the second electrode 110.

In the embodiments of the present disclosure, with the fourth via 111 hole located between the first electrode 109 and the gate electrode 105, and the fifth via hole 112 located between the gate electrode 105 and the second electrode 110, a part of the active layer 103 corresponding to a position between the first electrode 109 and the gate electrode 105 and a part of the active layer 103 corresponding to a position between the gate electrode 105 and the second electrode 110 can be exposed, thereby facilitating performing conductorization process on the exposed parts of the active layer 103. Moreover, the conductive resistance of the active layer 103 perpendicular to the areas of the first electrode 109 and the second electrode 110 can be reduced, thereby facilitating the transmission of the electrical signals, and improving the overall performance of the thin film transistor.

In a third aspect, the embodiments of the present disclosure provide a display device, including the thin film transistor described above, and the display device may be any product or component with a display function, such as a mobile phone, a tablet computer, a television, a display, a notebook computer, a digital photo frame, or a navigator. An implementation principle and beneficial effects of the display device are the same as those of the method for manufacturing a thin film transistor described above, and thus will not be repeated here.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and those modifications and improvements are also considered to fall within the scope of the present disclosure.

What is claimed is:

1. A method for manufacturing a thin film transistor, comprising:
   forming an active layer on a substrate by a single patterning process;
   forming a gate insulating layer by deposition on a side of the active layer away from the substrate;
   forming a first via hole and a second via hole both penetrating through the gate insulating layer by a single patterning process, wherein the first via hole and the second via hole is located at two ends of the active layer, respectively; and
   forming a first electrode, a gate electrode, and a second electrode on the gate insulating layer by a single patterning process, wherein the first electrode is connected to the active layer through the first via hole, the second electrode is connected to the active layer through the second via hole, and an orthographic projection of the gate electrode on the substrate at least partially overlapping an orthographic projection of the active layer on the substrate,
   wherein an orthographic projection of the first electrode on the substrate only partially overlaps an orthographic projection of the first via hole on the substrate; and
   an orthographic projection of the second electrode on the substrate only partially overlaps an orthographic projection of the second via hole on the substrate.

2. The method for manufacturing a thin film transistor of claim 1, before forming the active layer on the substrate by the single patterning process, further comprising:
   forming a barrier layer on the substrate by a single patterning process, wherein an orthographic projection of the barrier layer on the substrate at least partially overlaps the orthographic projection of the active layer on the substrate; and
   forming a buffer layer on a side of the barrier layer away from the substrate.

3. The method for manufacturing a thin film transistor of claim 2, before forming the first electrode, the gate electrode, and the second electrode on the gate insulating layer by the single patterning process, further comprising:
   forming a third via hole penetrating through the gate insulating layer and the buffer layer by a single patterning process to cause the second electrode to be connected to the barrier layer through the third via hole.

4. The method for manufacturing a thin film transistor of claim 1, wherein a material of the first electrode and the second electrode comprises copper, and a material of the active layer comprises an oxide semiconductor material; or, the material of the first electrode and the second electrode comprises aluminum, and the material of the active layer comprises an oxide semiconductor material containing zinc.

5. The method for manufacturing a thin film transistor of claim 1, after forming the first electrode, the gate electrode, and the second electrode on the gate insulating layer by the single patterning process, further comprising:

performing conductorization process on areas of the active layer corresponding to the first via hole and the second via hole.

6. The method for manufacturing a thin film transistor of claim 5, wherein performing the conductorization process on the areas of the active layer corresponding to the first via hole and the second via hole comprises:

etching a part, which is not covered by the first electrode, the gate electrode, and the second electrode, of the gate insulating layer by using the first electrode, the gate electrode, and the second electrode as a mask to expose a part of the active layer; and performing the conductorization process on the exposed part of the active layer.

7. The method for manufacturing a thin film transistor of claim 6, before performing the conductorization process on the areas of the active layer corresponding to the first via hole and the second via hole, further comprising:

keeping or stripping off a photoresist on the first electrode, the gate electrode, and the second electrode.

8. The method for manufacturing a thin film transistor of claim 1, after forming the first electrode, the gate electrode, and the second electrode on the gate insulating layer by the single patterning process, further comprising:

etching a part, which is not covered by the first electrode, the gate electrode, and the second electrode, of the gate insulating layer by using the first electrode, the gate electrode, and the second electrode as a mask such that the gate insulating layer is only partially etched.

9. The method for manufacturing a thin film transistor of claim 1, after forming the first electrode, the gate electrode, and the second electrode on the gate insulating layer by the single patterning process, further comprising:

etching the gate insulating layer by a dry etching process such that the gate insulating layer is only partially etched.

10. A thin film transistor, comprising: a substrate, an active layer on the substrate, a gate insulating layer on a side of the active layer away from the substrate, and a first electrode, a gate electrode, and a second electrode on a side of the gate insulating layer away from the substrate;

wherein the first electrode is connected to one end of the active layer through a first via hole penetrating through the gate insulating layer; the second electrode is connected to the other end of the active layer through a second via hole penetrating through the gate insulating layer; and an orthographic projection of the gate electrode on the substrate at least partially overlaps an orthographic projection of the active layer on the substrate, wherein an orthographic projection of the first electrode on the substrate only partially overlaps an orthographic projection of the first via hole on the substrate; and an orthographic projection of the second electrode on the substrate only partially overlaps an orthographic projection of the second via hole on the substrate.

11. The thin film transistor of claim 10, further comprising: a barrier layer on the substrate, and a buffer layer on a side of the barrier layer away from the substrate;

wherein an orthographic projection of the barrier layer on the substrate at least partially overlaps the orthographic projection of the active layer on the substrate.

12. The thin film transistor of claim 11, wherein the second electrode is connected to the barrier layer through a third via hole penetrating through the gate insulating layer and the buffer layer.

13. The thin film transistor of claim 10, further comprising: a fourth via hole and a fifth via hole both penetrating the gate insulating layer;

wherein the fourth via hole is between the first electrode and the gate electrode; and the fifth via hole is between the gate electrode and the second electrode.

14. The method for manufacturing a thin film transistor of claim 10, wherein a material of the first electrode and the second electrode comprises copper, and a material of the active layer comprises an oxide semiconductor material; or, the material of the first electrode and the second electrode comprises aluminum, and the material of the active layer comprises an oxide semiconductor material containing zinc.

15. The method for manufacturing a thin film transistor of claim 2, after forming the first electrode, the gate electrode, and the second electrode on the gate insulating layer by the single patterning process, further comprising:

performing conductorization process on areas of the active layer corresponding to the first via hole and the second via hole.

16. The method for manufacturing a thin film transistor of claim 15, wherein performing the conductorization process on the areas of the active layer corresponding to the first via hole and the second via hole comprises:

etching a part, which is not covered by the first electrode, the gate electrode, and the second electrode, of the gate insulating layer by using the first electrode, the gate electrode, and the second electrode as a mask to expose a part of the active layer; and performing the conductorization process on the exposed part of the active layer.

17. The method for manufacturing a thin film transistor of claim 2, after forming the first electrode, the gate electrode, and the second electrode on the gate insulating layer by the single patterning process, further comprising:

etching a part, which is not covered by the first electrode, the gate electrode, and the second electrode, of the gate insulating layer by using the first electrode, the gate electrode, and the second electrode as a mask such that the gate insulating layer is only partially etched.

* * * * *